(12) United States Patent
Nuebling et al.

(10) Patent No.: US 12,480,980 B2
(45) Date of Patent: Nov. 25, 2025

(54) TECHNIQUES AND DRIVER CIRCUITS CONFIGURED TO MONITOR LOAD CURRENT THROUGH A GATE INJECTION TRANSISTOR (GIT)

(71) Applicant: Infineon Technologies AG, Neubiberg (DE)

(72) Inventors: Marcus Nuebling, Olching-Esting (DE); Peter Weiss, Kelheim (DE); Christian Novak, Remseck am Neckar (DE); Christoph Bauer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 18/498,912

(22) Filed: Oct. 31, 2023

(65) Prior Publication Data
US 2025/0138056 A1 May 1, 2025

(51) Int. Cl.
*G01R 19/165* (2006.01)

(52) U.S. Cl.
CPC .............................. *G01R 19/16533* (2013.01)

(58) Field of Classification Search
CPC ................................................ G01R 19/16533
USPC ........................................................ 324/606
See application file for complete search history.

(56) References Cited

U.S. PATENT DOCUMENTS

| | | | |
|---|---|---|---|
| 10,979,032 B1 * | 4/2021 | Leong | H03K 17/56 |
| 11,456,735 B1 * | 9/2022 | Leong | H03K 17/162 |
| 2019/0123546 A1 * | 4/2019 | Wang | H02M 1/32 |
| 2021/0067154 A1 * | 3/2021 | Leong | H03K 17/691 |
| 2022/0102478 A1 * | 3/2022 | Sandow | H10D 12/00 |
| 2022/0224321 A1 * | 7/2022 | Kinoshita | H03K 19/01 |
| 2023/0145803 A1 * | 5/2023 | Maeda | H03K 17/166 |
| | | | 327/108 |

OTHER PUBLICATIONS

Hattori, Fumiya, et al. "Gate drive circuit suitable for a GaN gate injection transistor." IEEE Access 11 (2023): 43169-43182. (Year: 2023).*

Hackel, Jonathan, Michael Ebli, and Martin Pfost. "A novel gate driver approach using an inductive feed forward for a robust turn-on of GaN power transistors with gate injection." 2018 20th European Conference on Power Electronics and Applications (EPE'18 ECCE Europe). IEEE, 2018. (Year: 2018).*

Zhang, Zhengda, et al. "A closed-loop current source gate driver with active voltage balancing control for series-connected GaN HEMTs." 2021 IEEE Energy Conversion Congress and Exposition (ECCE). IEEE, 2021. (Year: 2021).*

Varajao et al., "Gate drive solutions for CoolGaN™ GIT HEMTs", Infineon Technologies AG, Whitepaper, Nov. 2021, 24 pp.

* cited by examiner

*Primary Examiner* — Christopher P Mcandrew
(74) *Attorney, Agent, or Firm* — Shumaker & Sieffert, P.A.

(57) ABSTRACT

This disclosure describes a driver circuit configured to control a gate injection transistor (GIT). The driver circuit is configured to output a control current to a gate of the GIT, detect a voltage at the gate of the GIT, and determine a load current through the GIT based on the voltage detected at the gate of the GIT. The voltage at the gate of the GIT may be dependent on both the load current and the control current.

17 Claims, 9 Drawing Sheets

TECHNIQUES AND DRIVER CIRCUITS CONFIGURED TO MONITOR LOAD CURRENT THROUGH A GATE INJECTION TRANSISTOR (GIT)

TECHNICAL FIELD

This disclosure relates to transistors that may be used as power switches, and more specifically, to gate injection transistors (GITs) that are controlled by injecting current into the gate of the transistor.

BACKGROUND

Power switches are used in a wide variety of applications in order to control power being delivered to a load. Field Effect Transistors (FETs), such as Metal-Oxide Field Effect Transistors (MOSFETs) are often used as power switches. FETs may be formed in silicon (Si), gallium nitride (GaN), silicon carbide (SiC), or another semiconductor material. Examples of MOSFETs may include, but are not limited to, PMOS, NMOS, DMOS, or any other type of MOSFET, or any combination of the same.

Power switches are typically controlled by one or more driver circuits via a voltage signal applied to the gate of a power switch so as to control on/off switching of the power switch. A microcontroller may provide control signals to the driver circuit(s) to provide system-level control over the power switches.

Some power switches, including some FETs formed in GaN materials are controlled by injecting a constant current at the gate of the power switch. These so-called gate injection transistors (GITs) can provide advantages over conventional voltage controlled MOSFETs in terms of efficiency, switching speeds, power density, and load current capacity.

SUMMARY

This disclosure describes techniques and driver circuits for controlling a gate injection transistor (GIT). A driver circuit may be configured to control the GIT by injecting current at the gate of the GIT. Moreover, according to this disclosure, the driver circuit can be configured to determine a load current through the GIT without any need for addition components, such as shunts or hall sensors that are conventionally used for load current monitoring. Accordingly, the circuit can achieve efficiencies by eliminating the need for shunts or hall sensors. In addition, the driver circuit may be configured to determine a temperature associated with the GIT based on the measured load current.

In some examples, this disclosure describes a driver circuit configured to control a GIT, wherein the driver circuit is configured to: output a control current to a gate of the GIT; detect a voltage at the gate of the GIT; and determine a load current through the GIT based on the voltage detected at the gate of the GIT, wherein the voltage at the gate of the GIT is dependent on both the load current and the control current.

In some examples, this disclosure describes a method performed by a gate driver circuit configured to control a GIT, the method comprising: outputting a control current to a gate of the GIT; detecting a voltage at the gate of the GIT; and determining a load current through the GIT based on the voltage detected at the gate of the GIT, wherein the voltage at the gate of the GIT is dependent on both the load current and the control current.

In some examples, this disclosure describes a system comprising: a GIT configured to be controlled by a current signal at a gate of the GIT; and a driver circuit configured to control the GIT, wherein the driver circuit is configured to: output a control current to the gate of the GIT; detect a voltage at the gate of the GIT; and determine a load current through the GIT based on the voltage detected at the gate of the GIT, wherein the voltage at the gate of the GIT is dependent on both the load current and the control current.

Details of these and other examples are set forth in the accompanying drawings and the description below. Other features, objects, and advantages will be apparent from the description and drawings, and from the claims.

BRIEF DESCRIPTION OF DRAWINGS

FIG. 6A shows gate voltage as a function of time, and FIG. 6B shows load current as a function of time.

DETAILED DESCRIPTION

This disclosure describes techniques and driver circuits for controlling a gate injection transistor (GIT). When controlling transistors, such as GITs, it is desirable to monitor load current through the transistor and temperature of the transistors. This is especially desirable when the transistors are used as power switches, e.g., to deliver power to a load. In many situations, the load current and the temperature of power switches are monitored by external components, such as shunt resistors or Hall sensors.

The techniques and circuits described in this disclosure recognize and leverage a special input characteristic associated with the structure of a GIT. In particular, the structure of the GIT can be used for monitoring load current and temperature of the GIT, without the need for shunts, Hall sensors, or other external current monitoring structure. By eliminating the need for shunts, Hall sensors, or other external current monitoring structures, the circuits and techniques of this disclosure can achieve efficiencies relative to convention circuits.

According to this disclosure, a driver circuit may be configured to control the GIT by injecting current at the gate of the GIT. Moreover, according to this disclosure, the driver circuit can be configured to determine a load current through the GIT without any need for additional components, such as shunts or Hall sensors. In addition, the driver circuit may be configured to determine a temperature associated with the GIT based on the measured load current.

GITs have a unique characteristic in that the load current and the gate current flow through part of the GIT. When the transistor is ON, load current flows from a drain of the GIT to a source of the transistor. In addition, when the transistor is ON, a control current flows from a gate of the GIT to the source. Accordingly, with a GIT, when the transistor is ON, both the load current and the control current pass through a portion of the load current path. In some examples, the techniques of this disclosure leverage this GIT structure to achieve load current sensing without the need for an external shunt or hall sensor. The GIT acts as a type of level shifter relative to the load current, and since the gate injection current is known, the load current can be determined by monitoring that portion of the GIT where both load current and the control current pass.

Figure 1:
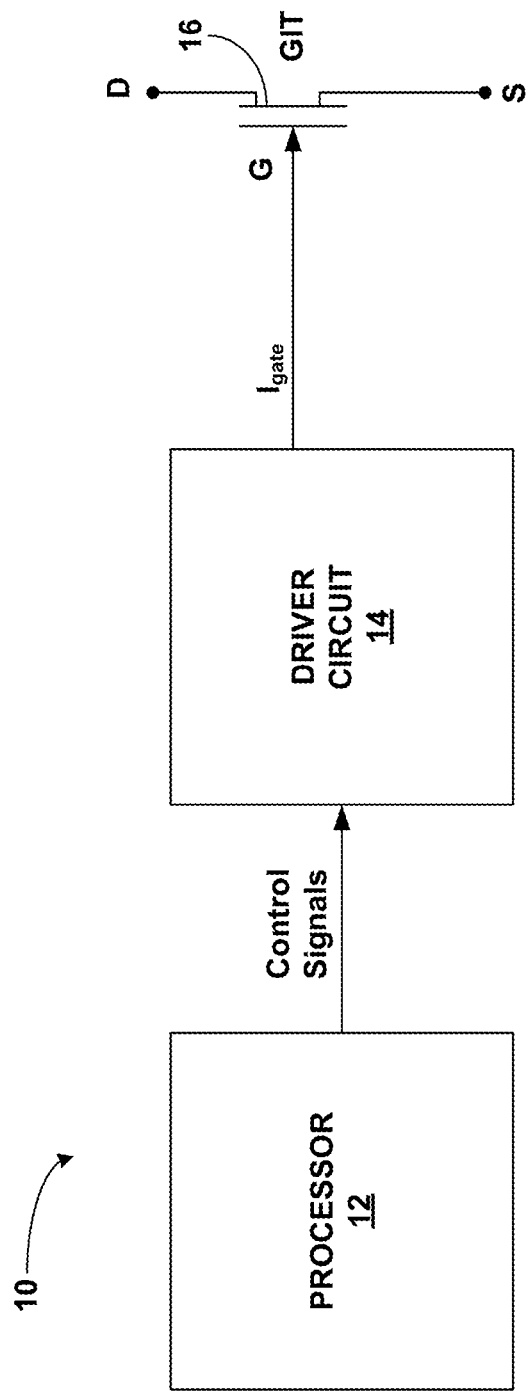
FIG. 1 is a block diagram of a system for controlling a gate injection transistor (GIT) consistent with this disclosure.

FIG. 1 is a block diagram of a system 10 for controlling a GIT 16 consistent with this disclosure. System 10 includes a processor 12 configured to generate control signals for controlling the ON/OFF state of GIT 16. A driver circuit 14 receives the control signals from processor 12 and generates a gate control signal ($I_{gate}$) for controlling GIT 16. The gate control signal ($I_{gate}$) comprises a constant current that is delivered to the gate at a defined voltage level. In some cases, the voltage at the gate may be elevated for an initial boost phase, followed by a lower gate voltage to deliver the constant gate control current ($I_{gate}$) to the gate of GIT 16.

Figure 2:
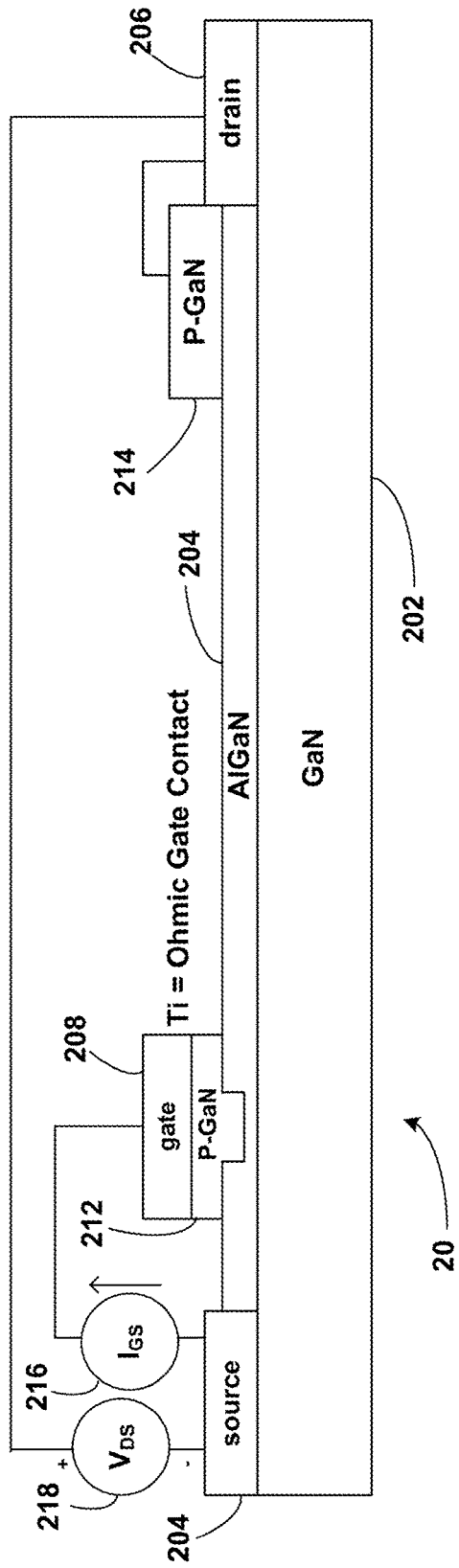
FIG. 2 is a conceptual cross-sectional side view of a GIT consistent with this disclosure.

FIG. 2 is a conceptual cross-sectional side view of a GIT 20 consistent with this disclosure. GIT 20 may correspond to GIT 10 of FIG. 1. In the example of FIG. 2, GIT 20 comprises a field effect transistor (FET) that is formed in gallium nitride (GaN). An aluminum gallium nitride layer (AlGaN) 204 is formed over a GaN layer 202 to separate source contact 204 from drain contact 206. Source contact 204 and drain contact 206 may be formed of a conductive metal material. Drain contact 206 may be electrically connected to a P-GaN layer 214 on the drain side. P-GaN layer 214 may comprise a doped GaN material. The p-GaN layer 214 on the drain side may help reduce current collapse effects, which may otherwise occur from exposure to high blocking voltages. Another P—GaN layer 212 is formed over AlGaN layer 204 and gate contact 208 is formed over P—GaN layer 212. Gate to source current is shown by element 216 and drain to source voltage is shown by element 218.

Figure 3:
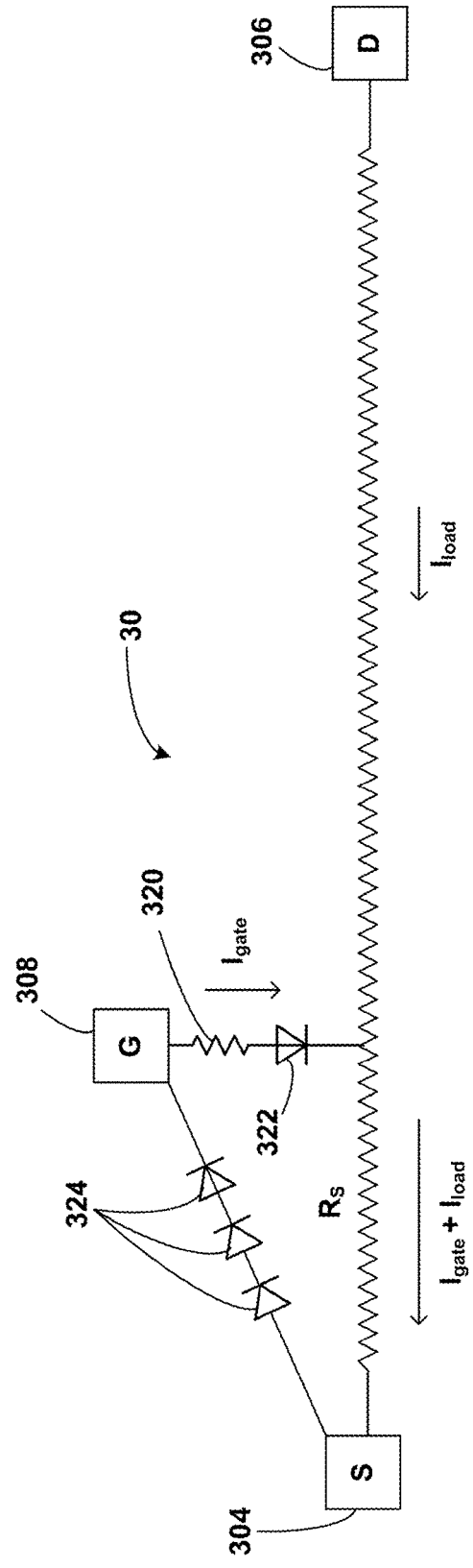
FIG. 3 is a circuit diagram showing an equivalent circuit model diagram consistent with the GIT illustrated in FIG. 2.

FIG. 3 is a circuit diagram showing an equivalent circuit model diagram 30 consistent with GIT 20 illustrated in FIG. 2. Source contact 304, gate contact 308 and drain contact 306 of FIG. 3 may generally correspond to source contact 204, gate contact 208 and drain contact 206 of FIG. 2. As shown in FIG. 3, a set of diodes 324 can be used to model the reverse behavior of the gate to source path of GIT 10, and the forward behavior of the gate to source path can be modeled by a resistor 320 and a diode 322. As further shown, for a GIT, the load current path from drain contact 306 to source contact 304 includes two portions. The first portion corresponds to the portion of the load current path between drain contact 306 and gate contact 308. The second portion is defined as $R_S$, and the $R_S$ portion includes both the load current $I_{load}$ and a gate current $I_{GATE}$ when the GIT is turned ON. The gate current $I_{gate}$ is control current delivered to gate contact 308, which also passes through second portion $R_S$ of GIT 30.

Figure 4B:
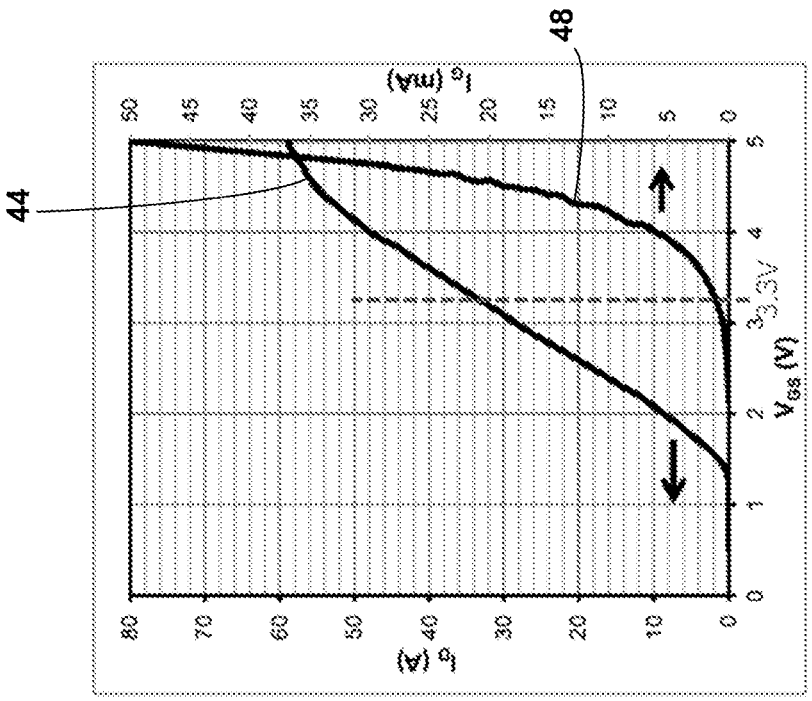
FIGS. 4A and 4B are example transfer functions of an example GIT consistent with this disclosure.
Figure 4A:
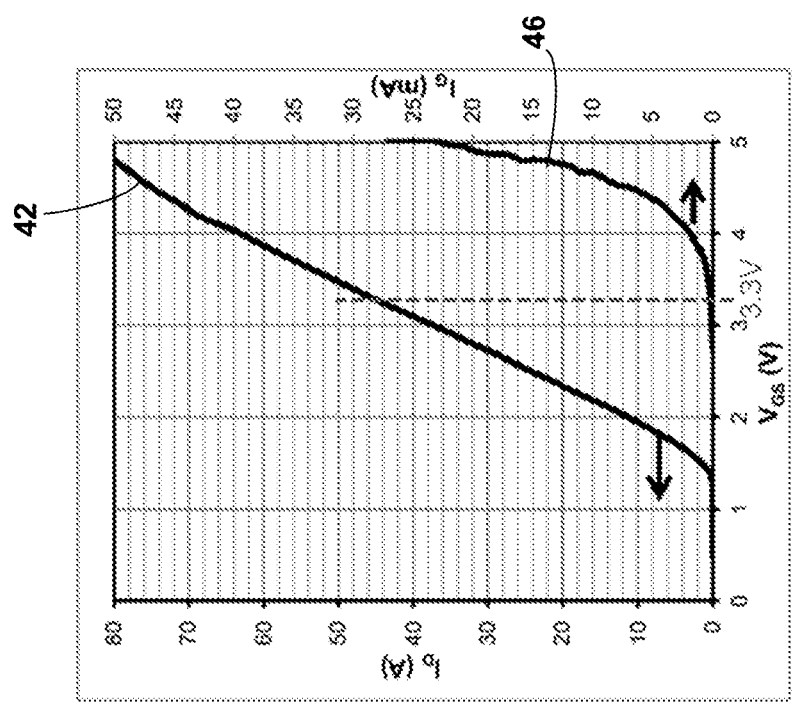

FIGS. 4A and 4B are example transfer functions of an example GIT consistent with this disclosure. In the transfer functions of FIGS. 4A and 4B, the load current as a function of the gate-to-source voltage ($V_{GS}$) is shown by lines 42, 44. The gate current as a function of $V_{GS}$ is shown by lines 46, 48. The gate current and load current are both a function of temperature, as can be appreciated by comparing line 46 of FIG. 4A to line 48 of FIG. 4B, and by comparing line 42 of FIG. 4A to line 44 of FIG. 4B. FIG. 4A is showing the transfer functions at 25 degrees Celsius, and FIG. 4B is showing the transfer functions at 125 degrees Celsius.

Figure 5:
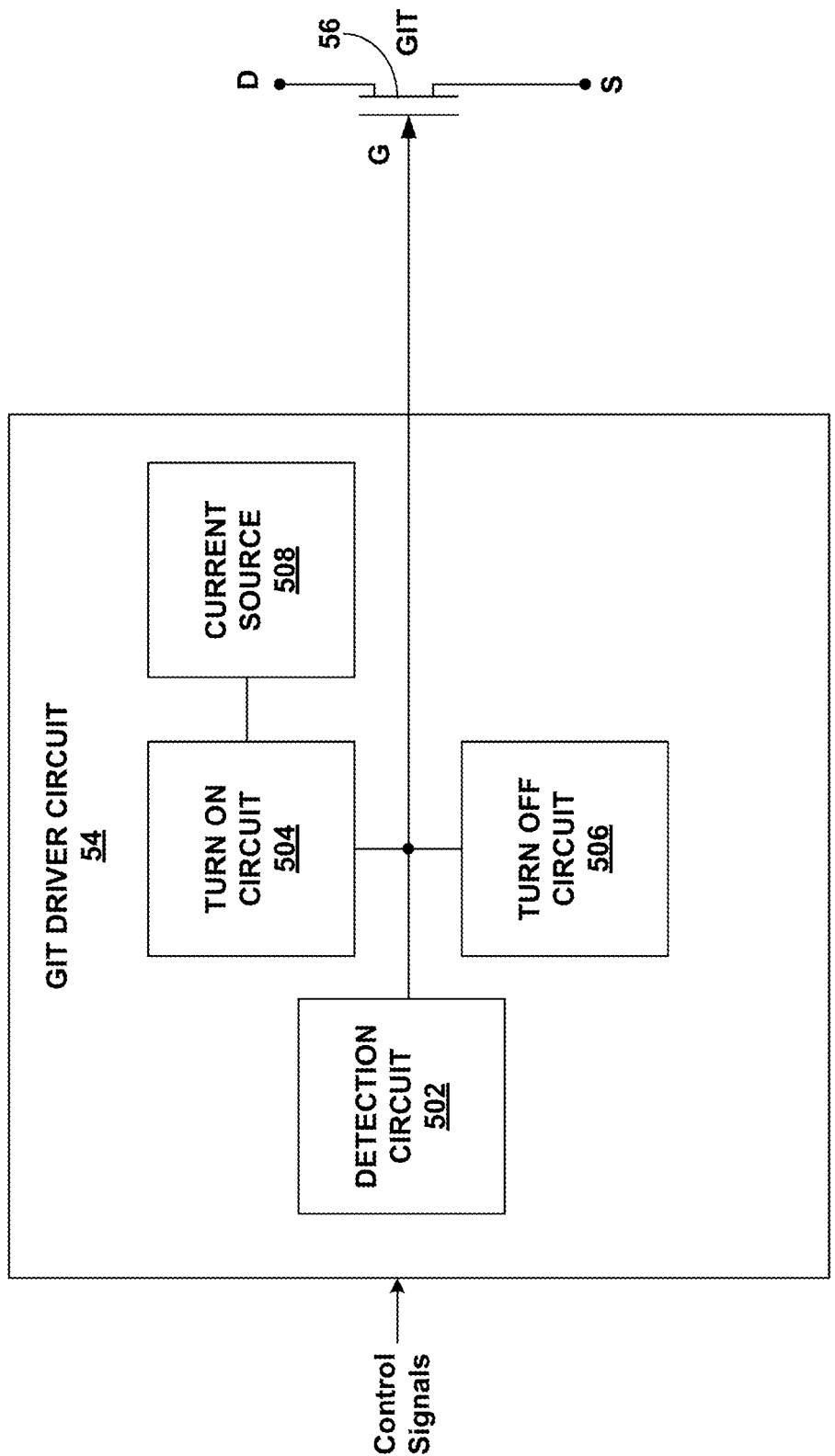
FIG. 5 is a block diagram of a GIT driver circuit for controlling a GIT consistent with this disclosure.

FIG. 5 is a block diagram of a GIT driver circuit 54 for controlling a GIT 56 consistent with this disclosure. GIT driver circuit 54 is one example of a driver circuit is configured to: output a control current to a gate of GIT 56, detect a voltage at the gate of the GIT 56, and determine a load current through GIT 56 based on the voltage detected at the gate of GIT 56, wherein the voltage at the gate of GIT 56 is dependent on both the load current and the control current.

In particular, GIT driver circuit 54 includes a turn on circuit 504 comprising a current delivery circuit, wherein the turn on circuit 504 is configured to output the control current to turn on GIT 56. For example, turn on circuit 504 may be connected to a current source 508, such that turn on circuit 504 can turn on to become a current delivery circuit from current source 508 to the gate of GIT 56.

GIT driver circuit 54 also includes a turn off circuit 506, which may be configured to short the control current from current source 508 to quickly and effectively turn off GIT 56. Moreover, consistent with this disclosure GIT driver circuit 54 includes a detection circuit 502 configured to determine a load current through GIT 56 based on a voltage detected at the gate of GIT 56.

In some examples, to determine the load current, detection circuit 502 may be configured to compare the voltage detected at the gate of GIT 56 to a fixed reference voltage and determine the load current based on a pre-defined transfer function associated with the GIT (e.g., such as a transfer function similar to those shown in FIGS. 4A and 4B). In this example, the pre-defined transfer function defines both the load current through the GIT and the control current at the gate when the voltage detected at the gate is greater than a threshold (e.g., 3.3 Volts) defined in the pre-defined transfer function associated with the GIT.

In some examples, to determine the load current, detection circuit 502 may be configured to determine a total current though a portion of GIT 56 (e.g., portion $R_S$ shown in FIG. 2) based on the voltage detected at the gate and determine the load current based on a difference between the total current and the control current. Additional details on the comparisons are discussed in more detail below.

Figure 6A:
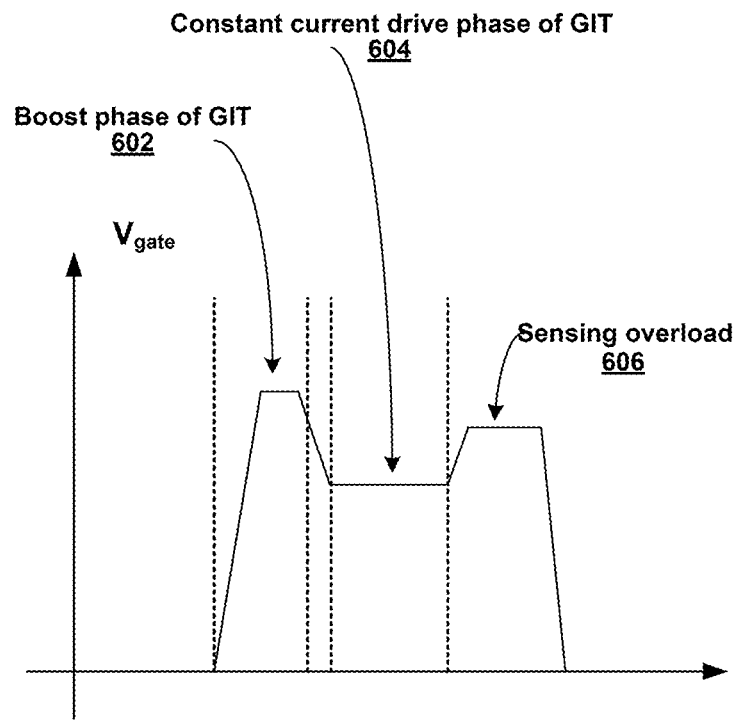
FIGS. 6A and 6B are two related graphs showing parameters associated with the control of a GIT.
Figure 6B:
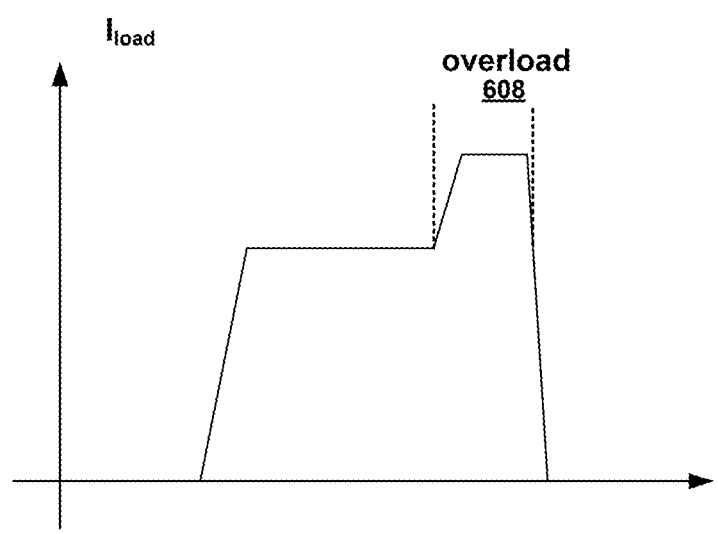

FIGS. 6A and 6B are two related graphs showing parameters associated with the control of a GIT. FIG. 6A shows gate voltage as a function of time, and FIG. 6B shows load current as a function of time. FIGS. 6A and 6B will be described from the perspective of GIT driver circuit 54 of FIG. 5. In some examples, in order to control GIT 56, GIT driver circuit 54 controls turn on circuit 504 to output the control current in an initial boost phase 602, wherein the initial boost phase defines a first gate voltage. Then, GIT driver circuit 54 controls turn on circuit 504 to output the control current in a drive phase 604 that follows the boost phase 602, wherein the drive phase defines a second gate voltage that is lower than the first gate voltage. In this case, to detect the voltage at the gate of the GIT, detection circuit 502 may be configured to detect the second gate voltage, e.g., that corresponding to the voltage at constant current drive phase 604. A sensing overload 606, 608, for example, can be detected by detection circuit 502 based on a rise in the detected gate voltage relative to that expected in drive phase. This voltage measurement can also be mapped to a temperature measurement, e.g., based on known or pre-defined transfer functions at different temperatures (like those shown in FIGS. 4A, 4B). Accordingly, in some examples, GIT driver circuit 54 may be further configured to determine a temperature associated with GIT 56 based on the determined load current.

Figure 7:
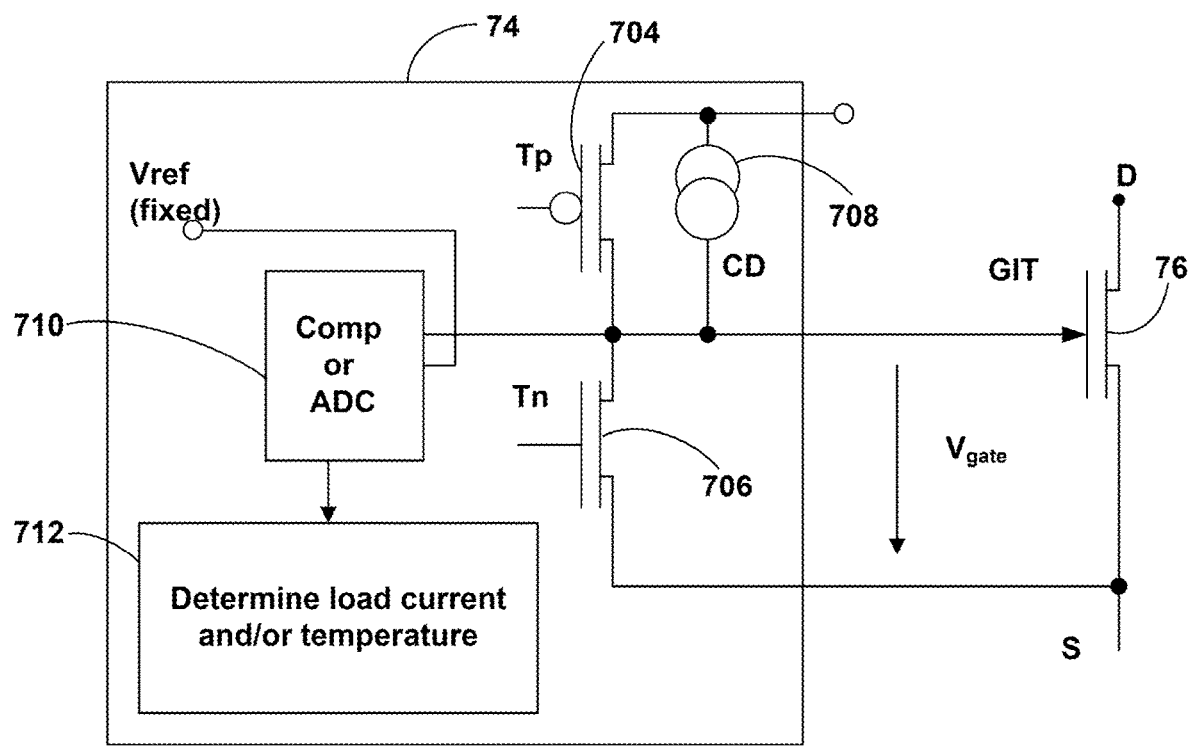
FIGS. 7-9 are block diagrams showing different examples of a GIT driver circuit for controlling a GIT consistent with this disclosure.
Figure 8:
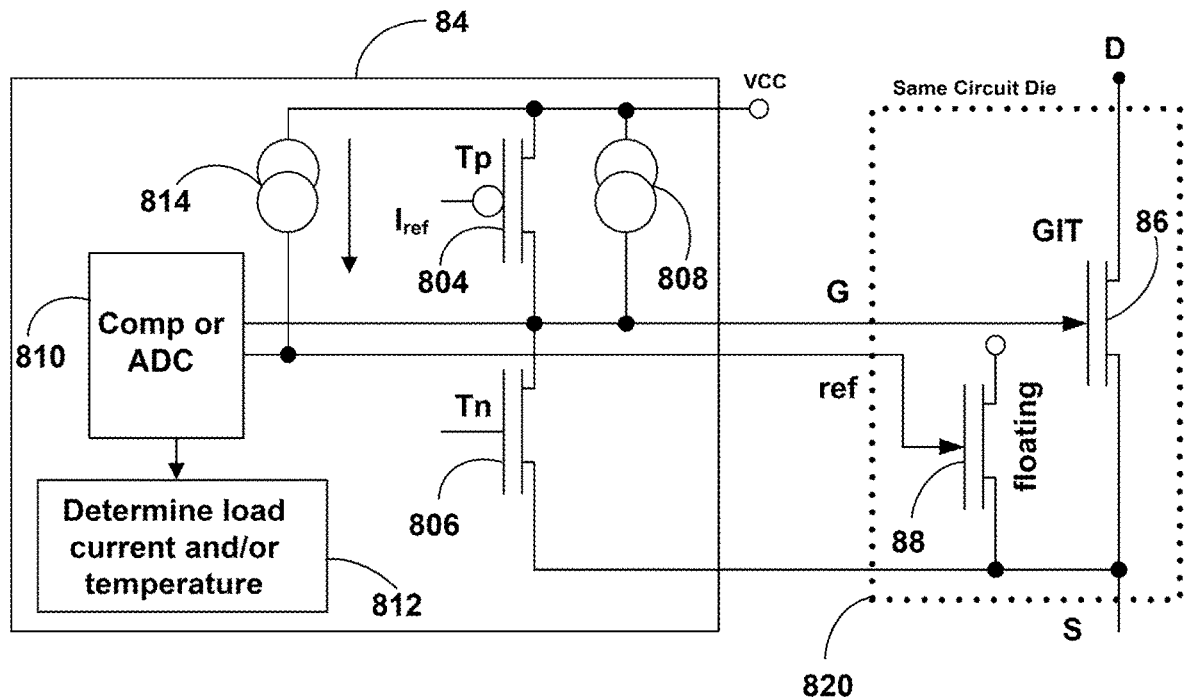
Figure 9:
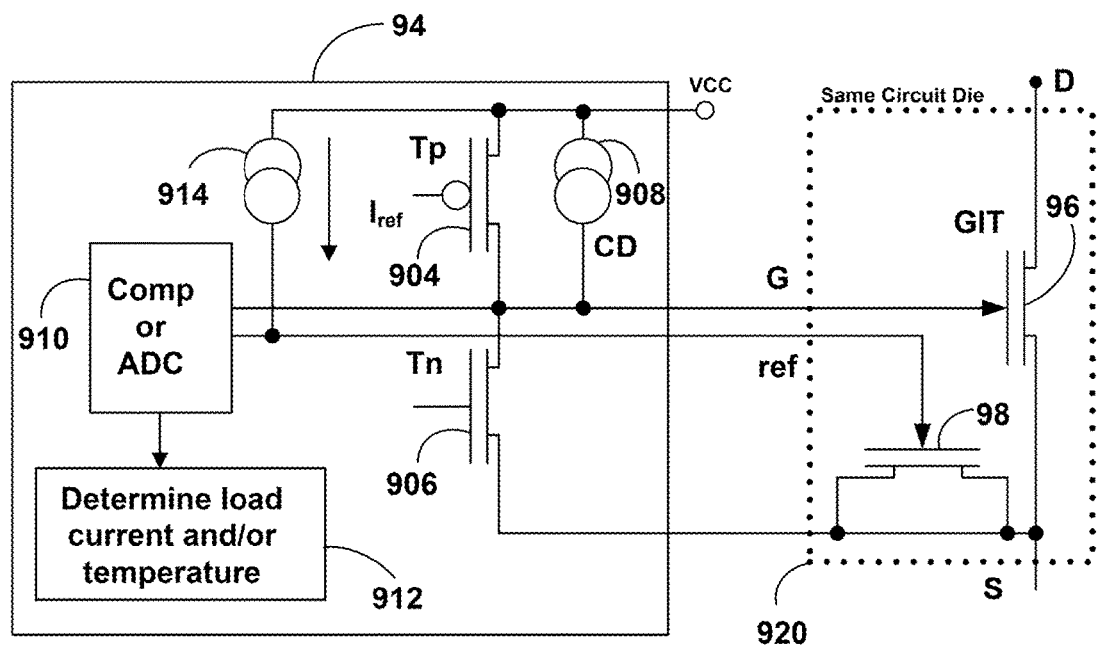

FIGS. 7-9 are block diagrams showing different examples of a GIT driver circuit for controlling a GIT consistent with this disclosure.

GIT driver 74 of FIG. 7 is one example of a driver circuit configured to control a GIT 76, wherein the driver circuit is configured to: output a control current to a gate of the GIT; detect a voltage at the gate of the GIT; and determine a load current through the GIT based on the voltage detected at the gate of the GIT, wherein the voltage at the gate of the GIT is dependent on both the load current and the control current. Turn on transistor 704 and current source 708 (e.g., a current delivery circuit) form a turn on circuit configured to output a control current to turn on GIT 76. Turn on transistor 704 may include an inverted input such that turn on signal turns OFF transistor 704 to deliver current from current source 708 to the gate of GIT 76. Turn off transistor 706 may be configured to turn off the current delivery, e.g., turning ON to short the control current, which can turn off GIT 76.

Units 710 and 712 of FIG. 7 form a detection circuit configured to determine a load current through the GIT 76 based on the voltage detected at the gate of the GIT. For example, unit 710 may comprise a comparator or an analog to digital converter (ADC) configured to compare the voltage detected at the gate of GIT 76 to a fixed reference voltage (Vref). Unit 712 may be configured to determine the load current based on a pre-defined transfer functions associated with the GIT, such as a transfer functions similar to those shown in FIGS. 4A and 4B. The pre-defined transfer functions define both the load current through GIT 76 (e.g., lines 42 and 44) and the control current at the gate (lines 46 and 48) when the voltage detected at the gate is greater than a threshold (e.g., 3.3 Volts in the example of FIGS. 4A and 4B), which is defined in the pre-defined transfer functions associated with the GIT. For example, to determine the load current, unit 712 of driver circuit 74 may be configured to: determine a total current though a portion of GIT 76 based on the voltage detected at the gate (e.g., the $R_S$ portion shown in FIG. 3), and determine the load current based on a difference between the total current and the control current that is being delivered by driver circuit 74 to GIT 76.

The voltage detected at the gate can also be mapped to a temperature measurement, e.g., based on known or pre-defined transfer functions at different temperatures (like those shown in FIGS. 4A, 4B). Accordingly, in some examples, GIT driver circuit 74 may be further configured to determine a temperature associated with GIT 76 based on the determined load current. In still other examples, some of the functionality of units 710, 712 can be performed by an external processor (e.g., processor 12 shown in FIG. 1), in which case, unit 710 may comprise an ADC configured to generate the measured voltage at the gate of GIT 76 and output a digital representation of that voltage to the external processor for comparison to the fixed voltage reference.

GIT driver 84 of FIG. 8 is another example of a driver circuit configured to control a GIT 86, wherein the driver circuit is configured to: output a control current to a gate of the GIT; detect a voltage at the gate of the GIT; and determine a load current through the GIT based on the voltage detected at the gate of the GIT, wherein the voltage at the gate of the GIT is dependent on both the load current and the control current. Turn on transistor 804 and current source 808 (e.g., a current delivery circuit) form a turn on circuit configured to output a control current to turn on GIT 86. Turn on transistor 804 may include an inverted input such that turn on signal turns OFF transistor 804 to deliver current from current source 808 to the gate of GIT 86. Turn off transistor 806 may be configured to turn off the current delivery, e.g., turning ON to short the control current, which can turn off GIT 86.

Units 810 and 812 of FIG. 8 form a detection circuit configured to determine a load current through the GIT 86 based on the voltage detected at the gate of the GIT. For example, unit 810 may comprise a comparator or an ADC configured to compare the voltage detected at the gate of GIT 86 reference voltage. In this example, however, the reference voltage is not fixed like the example of FIG. 7. Instead, the reference voltage is determined (e.g., measured) based on a floating reference structure 88. Reference structure 88 essentially mimics a portion of GIT 86 from its gate to its source (e.g., from gate 308 to source 304 as shown in FIG. 3). Moreover, reference structure 88 is formed on a same circuit die 820 as GIT 86, which ensures that process variations do not affect any measurements or results. Driver circuit 84 may include an additional current source 814 for controlling reference structure 88. Turn on transistor 804 and turn off transistor 806 are configured to turn on GIT 86 and simultaneously deliver a DC bias current from current source 814 to reference structure 88. Reference structure 88 may comprise a switch or a different type of circuit typology configured to provide the reference.

Units 810 and 812 may be configured to determine the load current through GIT. In particular, by controlling the additional current source 814 for reference structure 88 simultaneously with the control of current source 808 for GIT 86, driver circuit is configured to generate a reference voltage based on a voltage drop over reference structure 88. In this case, to generate the reference voltage, driver circuit 84 is configured to deliver a second current from current source 814 to reference structure 88, wherein the second current matches the control current from current source 808 to GIT 86. Reference structure 88 defines a resistance that matches a resistance of a portion of the GIT (e.g., portion $R_S$ shown in FIG. 3), wherein both the load current and the control current flow through the portion of GIT 86 (e.g., portion $R_S$ shown in FIG. 3).

The voltage detected at the gate can also be mapped to a temperature measurement, e.g., based on known or pre-defined transfer functions at different temperatures (like those shown in FIGS. 4A, 4B). Accordingly, in some examples, GIT driver circuit 84 may be further configured to determine a temperature associated with GIT 86 based on the determined load current. In still other examples, some of the functionality of units 810, 812 can be performed by an external processor (e.g., processor 12 shown in FIG. 1), in which case, unit 810 may comprise an ADC configured to generate the measured voltage at the gate of GIT 86 and output a digital representation of that voltage to the external processor for comparison to the fixed voltage reference.

In some examples, to determine the load current, driver circuit 84 may be configured to: compare the voltage detected at the gate to the reference voltage defined by the voltage drop over reference structure 88 and determine the load current based on comparing the voltage detected at the gate to the reference voltage. More specifically, to determine the load current, driver circuit 84 may be configured to: determine a voltage drop associated with load current based on subtracting the reference voltage from the voltage detected at the gate of GIT 86 and determine the load current based on the voltage drop associated with the load current.

In some examples, reference structure 88 operates like a Zenar diode, e.g., in a manner equivalent to operation of a Zener diode. Reference structure 88 may comprise any structure built to have similar transfer characteristics as GIT 86, such as that shown by the gate current transfer function shown in FIGS. 4A and 4B. For example, reference structure 88 may operate in a manner equivalent to a Zenar diode with an approximately 3.3 volt Zenar break down. In some examples, reference structure 88 comprises a regular diode with an approximately 3.3 volt break down and a very large forward voltage rating. In some examples, reference structure 88 may comprise a FET (such as a MOSFET) with drain and gate connected together such that drain to source operates as an active (controllable) a MOS diode. The transfer function of reference structure 88 can be modelled as a type of Zener Diode in reverse operation, or as a pn diode forward biased (e.g., with an uncommonly high forward bias drop).

GIT driver 94 of FIG. 9 is another example of a driver circuit configured to control a GIT 96, wherein the driver circuit is configured to: output a control current to a gate of the GIT; detect a voltage at the gate of the GIT; and determine a load current through the GIT based on the voltage detected at the gate of the GIT, wherein the voltage at the gate of the GIT is dependent on both the load current and the control current. Driver circuit 94 of FIG. 9 is very similar to driver circuit 84 of FIG. 8, and driver circuit 94 operates in a similar manner as driver circuit 84 explained above. Therefore, the details above driver circuit operation in FIG. 8 will not be repeated here.

Driver circuit 94 operates like driver circuit 84, and GIT 96 operates like GIT 86. Current sources 908, 914 operate like current sources 808, 814. Transistors 904, 906 operate like transistor 804, 806. Units 910, 912 operate like units 810, 812. Reference structure 98 is formed on a same circuit die 920 as GIT 96. The only difference between FIG. 8 and FIG. 9 is that with FIG. 8, reference structure 88 is floating, with its drain node floating, whereas with FIG. 9, reference structure 98 has its drain and source nodes connected to the same circuit node on the low side of turn off transistor 906. In other words, the drain and source are short circuited to one another in reference structure 98 of FIG. 9.

With the examples shown in FIGS. 8 and 9, the gate of GIT 86, 96 works as a kind of level shifter, and due to the GIT behavior, the load current or overtemperature can be detected by the driver 84, 94 when the driver is in current driving mode. A comparator or ADC 810, 910 can detect an overcurrent. With a calibration when no current is flowing (e.g., for an example in motor control applications) the calibration can be stored as a "reference" value in the driver circuit for use by comparator or ADC 810, 910 when GIT 86, 96 is in operation.

Figure 10:
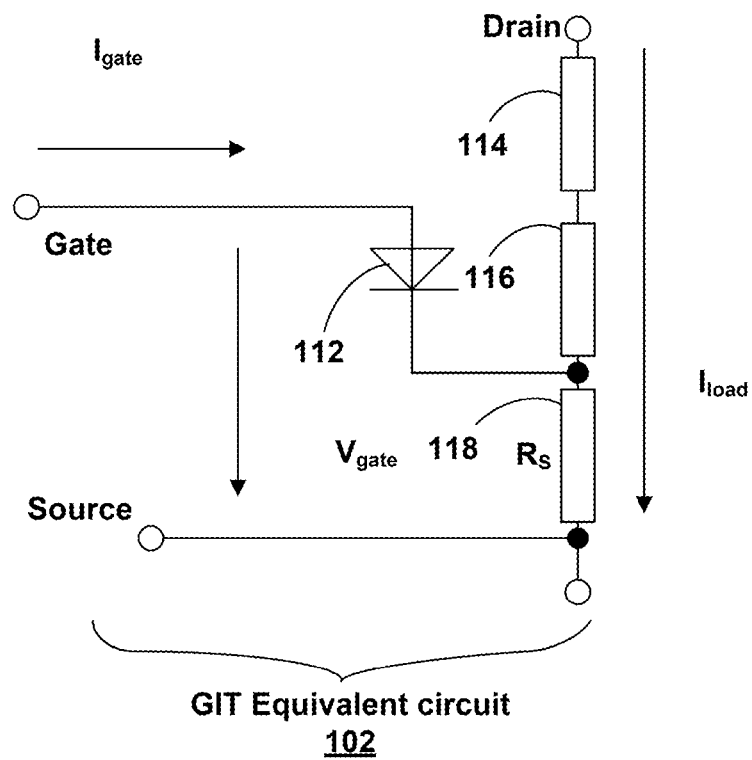
FIGS. 10 and 11 are equivalent circuit model diagrams that demonstrate electrical characteristics of a GIT consistent with this disclosure.
Figure 11:
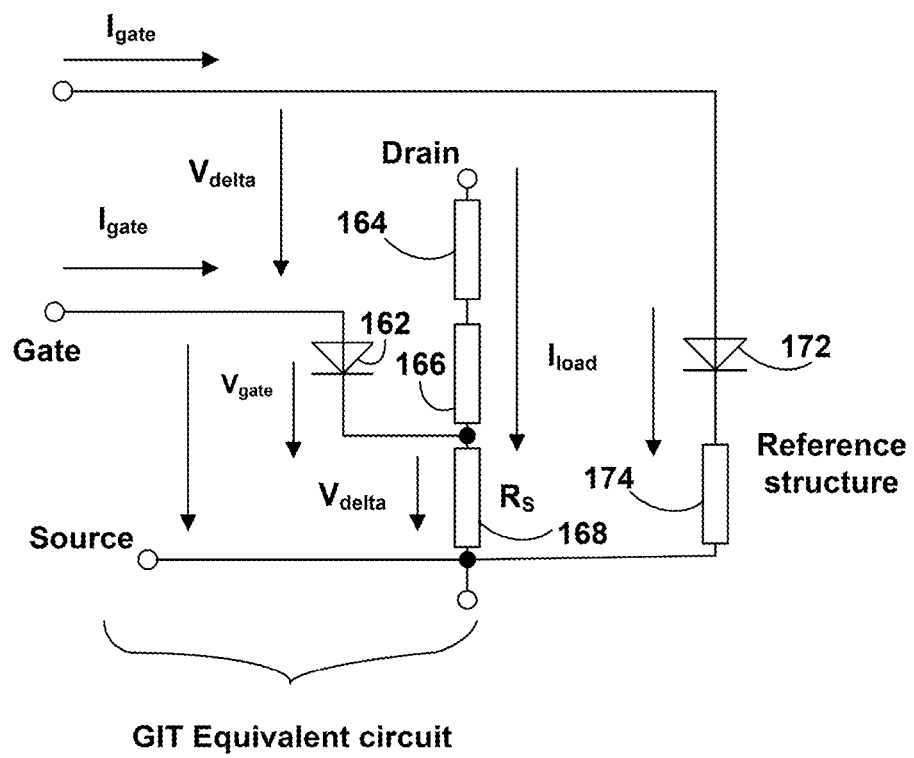

FIGS. 10 and 11 are equivalent circuit model diagrams that demonstrate electrical characteristics of a GIT consistent with this disclosure. In particular, GIT equivalent circuit 102 represents a circuit equivalent to a GIT with resistors 114, 116, 118 defining a load current path from drain to source, and resistor Rs 118 defining a portion of the load current path that includes both the load current and the control current (Igate) applied at the gate of the GIT. The gate to source path of the GIT is modeled by diode 112 and resistor Rs 118. Thus, by using a reference structure that matches elements 112, 118, a driver circuit can zero out the voltage drop associated with control current through resistor Rs 118 to determine the actual load current through resistor Rs 118 without the need for any shunt or Hall sensor.

For example, as shown in FIG. 11, a reference structure may be configured to model diode 172 and resistor 174 in a way that matches diode 162 and resistor Rs 168. This reference structure can be formed on the same circuit die as the GIT (which is modeled by elements 162, 164, 166, 168. A driver circuit can then use the voltage drop over the reference structure (modeled by elements 172, 174) to zero out the voltage drop over the portion of the GIT that is modeled by elements 162, 168. This can produce an accurate measurement of the voltage drop associated with the load current thought resistor Rs without the effects of the control current (Igate).

The techniques and circuits described above leverage the special characteristic of a GIT structure to essentially level shift the voltage drop across the source portion of the channel resistance Rs. No shunt is needed, and no additional sensing structure is needed. Also, the measurements described herein can be more precise relative to measurements made by desaturation (DESAT) detection functions sometimes used in driver circuits. The increase in voltage drop over channel resistance Rs relative to the load current over the source portion of the channel resistance Rs is naturally level shifted by the GIT structure to the gate, which according to this disclosure, can be measured inside the driver.

Figure 12:
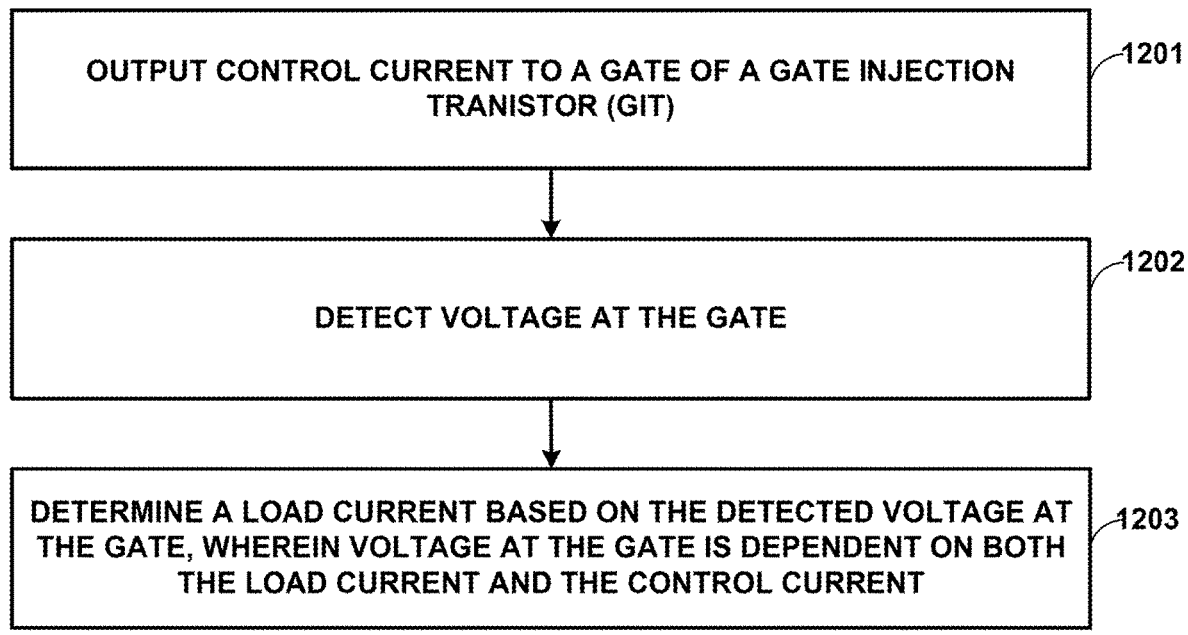
FIG. 12 is a flow diagram illustrating a technique consistent with this disclosure.

FIG. 12 is a flow diagram illustrating a technique that may be performed by driver circuit 14, 54, 74, 84, 94 consistent with this disclosure. FIG. 12 will be described from the perspective of driver circuit 14 of FIG. 1, but the techniques may be applied by driver circuits 54, 74, 84, 94 of FIG. 5, 7, 8 or 9, or by another type of driver circuit.

FIG. 12 shows a method performed by driver circuit 14 (e.g., a gate driver circuit) that is configured to control GIT 16. As shown in FIG. 12, driver circuit 14 is configured to output a control current to a gate of GIT 16 (1201) and detect a voltage at the gate of the GIT 16 (1202). Driver circuit 14 is further configured to determine a load current through GIT 16 based on the voltage detected at the gate of the GIT, wherein the voltage at the gate of the GIT is dependent on both the load current and the control current.

In some examples, the process of determining the load current by driver circuit 14 comprises comparing the voltage detected at the gate to a fixed reference voltage, and determining the load current based on a pre-defined transfer function associated with GIT 16, wherein the pre-defined transfer function defines both the load current through GIT 16 and the control current at the gate when the voltage detected at the gate is greater than a threshold defined in the pre-defined transfer function associated with GIT 16. In some examples, the process of determining the load current by driver circuit 14 comprises determining the load current based on the pre-defined function includes: determining a total current though a portion of GIT 16 based on the voltage detected at the gate, and determining the load current based on a difference between the total current and the control current.

Consistent with FIGS. 6A and 6B, in some examples the process of outputting the control current by driver circuit 14 comprises outputting the control current in an initial boost phase, wherein the initial boost phase defines a first gate voltage, and outputting the constant current in a drive phase that follows the boost phase, wherein the drive phase defines a second gate voltage that is lower than the first gate voltage.

In this case, detecting the voltage at the gate of the GIT comprises driver circuit 14 detecting the second gate voltage.

In some examples, the method shown in FIG. 12 further comprises generating a reference voltage based on a voltage drop over a reference structure, wherein generating the reference voltage comprises delivering a second current to the reference structure, wherein the second current matches the control current, wherein the reference structure defines a resistance that matches a resistance of a portion of the GIT, and wherein both the load current and the control current flow through the portion of the GIT. In this case, the process of determining the load current by driver circuit 14 may comprise comparing the voltage detected at the gate to the reference voltage and determining the load current based on comparing the voltage detected at the gate to the reference voltage. Moreover, the process of determining the load current may comprise determining a voltage drop associated with load current based on subtracting the reference voltage from the voltage detected at the gate and determining the load current based on the voltage drop associated with the load current.

According to this disclosure, a constant current biasing a GIT structure can be used for switching a GIT in the form of a GaN transistor in an onstate, and may be used at the same time as a levleshifter to detect the load current and/or overtemperature from the source portion of the channel resistance Rs. In some examples, the circuits of this disclosure can achieve a very accurate $K_{IL/IS}$, which is a ratio between the load current IL and the sense current $I_{IS}$.

The techniques described in this disclosure may be implemented, at least in part, in circuitry, hardware, software, firmware or any combination thereof. Such hardware, software, and firmware may be implemented within the same device or within separate devices to support the various operations and functions described in this disclosure. In addition, any of the described units, modules or components may be implemented together or separately as discrete but interoperable circuits or devices. Depiction of different features as modules or units is intended to highlight different functional aspects and does not necessarily imply that such modules or units must be realized by separate components. Rather, functionality associated with one or more modules or units may be performed by separate components or circuits or integrated within common components or circuits. It may also be possible for one or more aspects of this disclosure to be performed in software, particularly for examples where functions may be performed by a processor, in which case those aspects of the techniques described in this disclosure may also be embodied or encoded in a computer-readable medium that stores instructions that are executed by the processor to achieve the described functions.

The following numbered aspects demonstrate one or more aspects of the disclosure.

Clause 1—A driver circuit configured to control a GIT, wherein the driver circuit is configured to: output a control current to a gate of the GIT; detect a voltage at the gate of the GIT; and determine a load current through the GIT based on the voltage detected at the gate of the GIT, wherein the voltage at the gate of the GIT is dependent on both the load current and the control current.

Clause 2—The driver circuit of clause 1, wherein the driver circuit comprises: a turn on circuit comprising a current delivery circuit, wherein the turn on circuit is configured to output the control current to turn on the GIT; a turn off circuit configured to short the control current to turn off the GIT; and a detection circuit configured to determine the load current through the GIT based on the voltage detected at the gate of the GIT.

Clause 3—The driver circuit of clause 1 or 2, wherein to determine the load current, the driver circuit is configured to: compare the voltage detected at the gate to a fixed reference voltage; and determine the load current based on a pre-defined transfer function associated with the GIT, wherein the pre-defined transfer function defines both the load current through the GIT and the control current at the gate when the voltage detected at the gate is greater than a threshold defined in the pre-defined transfer function associated with the GIT.

Clause 4—The driver circuit of any of clauses 1-3, wherein to determine the load current, the driver circuit is configured to: determine a total current though a portion of the GIT based on the voltage detected at the gate; and determine the load current based on a difference between the total current and the control current.

Clause 5—The driver circuit of any of clauses 1-4, wherein to output the control current, the driver circuit is configured to: output the control current in an initial boost phase, wherein the initial boost phase defines a first gate voltage; and output the control current in a drive phase that follows the boost phase, wherein the drive phase defines a second gate voltage that is lower than the first gate voltage, wherein to detect the voltage at the gate of the GIT, the driver circuit is configured to detect the second gate voltage.

Clause 6—The driver circuit of any of clauses 1-5, wherein to output the control current, the driver circuit is configured to: output the control current in an overload phase that occurs during the drive phase, wherein the driver circuit is configured to identify the overload phase based on the load current and disable the control current in response to identifying the overload phase.

Clause 7—The driver circuit of any of clauses 1-6, wherein the driver circuit is further configured to determine a temperature associated with the GIT based on the load current.

Clause 8—The driver circuit of any of clauses 1-2 or 4-7, wherein the driver circuit is configured to: generate a reference voltage based on a voltage drop over a reference structure, wherein to generate the reference voltage, the driver circuit is configured to deliver a second current to the reference structure, wherein the second current matches the control current, and wherein the reference structure defines a resistance that matches a resistance of a portion of the GIT, wherein both the load current and the control current flow through the portion of the GIT.

Clause 9—The driver circuit of clause 8, wherein to determine the load current, the driver circuit is configured to: compare the voltage detected at the gate to the reference voltage; and determine the load current based on comparing the voltage detected at the gate to the reference voltage.

Clause 10—The driver circuit of any of clauses 8 or 9, wherein to determine the load current, the driver circuit is configured to: determine a voltage drop associated with load current based on subtracting the reference voltage from the voltage detected at the gate; and determine the load current based on the voltage drop associated with the load current.

Clause—11 A method performed by a gate driver circuit configured to control a GIT, the method comprising: outputting a control current to a gate of the GIT; detecting a voltage at the gate of the GIT; and determining a load current through the GIT based on the voltage detected at the gate of the GIT, wherein the voltage at the gate of the GIT is dependent on both the load current and the control current.

Clause 12—The method of clause 11, wherein determining the load current includes: comparing the voltage detected at the gate to a fixed reference voltage; and determining the load current based on a pre-defined transfer function associated with the GIT, wherein the pre-defined transfer function defines both the load current through the GIT and the control current at the gate when the voltage detected at the gate is greater than a threshold defined in the pre-defined transfer function associated with the GIT.

Clause 13—The method of clause 11 or 12, wherein determining the load current based on the pre-defined function includes: determining a total current though a portion of the GIT based on the voltage detected at the gate; and determining the load current based on a difference between the total current and the control current.

Clause 14—The method of any of clauses 11-13, wherein outputting the control current includes: outputting the control current in an initial boost phase, wherein the initial boost phase defines a first gate voltage; and outputting the constant current in a drive phase that follows the boost phase, wherein the drive phase defines a second gate voltage that is lower than the first gate voltage, wherein detecting the voltage at the gate of the GIT comprises detecting the second gate voltage.

Clause 15—The method of any of clauses 11, 13, or 14, the method further comprising: generating a reference voltage based on a voltage drop over a reference structure, wherein generating the reference voltage comprises delivering a second current to the reference structure, wherein the second current matches the control current, wherein the reference structure defines a resistance that matches a resistance of a portion of the GIT, and wherein both the load current and the control current flow through the portion of the GIT.

Clause 16—The method of any of clauses 11 or 13-15, wherein determining the load current comprises: comparing the voltage detected at the gate to the reference voltage; and determining the load current based on comparing the voltage detected at the gate to the reference voltage.

Clause 17—The method of any of clauses 11 or 13-16, wherein determining the load current comprises: determining a voltage drop associated with load current based on subtracting the reference voltage from the voltage detected at the gate; and determining the load current based on the voltage drop associated with the load current.

Clause 18—A system comprising: a GIT configured to be controlled by a current signal at a gate of the GIT; and a driver circuit configured to control the GIT, wherein the driver circuit is configured to: output a control current to the gate of the GIT; detect a voltage at the gate of the GIT; and determine a load current through the GIT based on the voltage detected at the gate of the GIT, wherein the voltage at the gate of the GIT is dependent on both the load current and the control current.

Clause 19—The system of clause 18, wherein the GIT comprises a FET formed in GaN.

Various devices, circuits, methods, and features have been described in this disclosure. These and other devices, circuits, methods and features are within the scope of the following claims.

The invention claimed is:

1. A driver circuit configured to control a gate injection transistor (GIT), wherein the driver circuit is configured to:
output a control current to a gate of the GIT;
detect a voltage at the gate of the GIT; and
determine a load current through the GIT based on the voltage detected at the gate of the GIT, wherein the voltage at the gate of the GIT is dependent on both the load current and the control current, wherein to determine the load current, the driver circuit is configured to:
compare the voltage detected at the gate to a fixed reference voltage; and
determine the load current based on a pre-defined transfer function associated with the GIT, wherein the pre-defined transfer function defines both the load current through the GIT and the control current at the gate when the voltage detected at the gate is greater than a threshold defined in the pre-defined transfer function associated with the GIT.

2. The driver circuit of claim 1, wherein the driver circuit comprises:
a turn on circuit comprising a current delivery circuit, wherein the turn on circuit is configured to output the control current to turn on the GIT;
a turn off circuit configured to short the control current to turn off the GIT; and
a detection circuit configured to determine the load current through the GIT based on the voltage detected at the gate of the GIT.

3. The driver circuit of claim 1, wherein to determine the load current, the driver circuit is further configured to:
determine a total current though a portion of the GIT based on the voltage detected at the gate; and
determine the load current based on a difference between the total current and the control current.

4. The driver circuit of claim 1, wherein to output the control current, the driver circuit is configured to:
output the control current in an initial boost phase, wherein the initial boost phase defines a first gate voltage; and
output the control current in a drive phase that follows the boost phase, wherein the drive phase defines a second gate voltage that is lower than the first gate voltage, wherein to detect the voltage at the gate of the GIT, the driver circuit is configured to detect the second gate voltage.

5. The driver circuit of claim 1, wherein to output the control current, the driver circuit is configured to:
output the control current in an overload phase that occurs during a drive phase, wherein the driver circuit is configured to identify the overload phase based on the load current and disable the control current in response to identifying the overload phase.

6. The driver circuit of claim 1, wherein the driver circuit is further configured to determine a temperature associated with the GIT based on the load current.

7. A driver circuit configured to control a gate injection transistor (GIT), wherein the driver circuit is configured to:
output a control current to a gate of the GIT;
detect a voltage at the gate of the GIT;

determine a load current through the GIT based on the voltage detected at the gate of the GIT, wherein the voltage at the gate of the GIT is dependent on both the load current and the control current; and generate a reference voltage based on a voltage drop over a reference structure, wherein to generate the reference voltage, the driver circuit is configured to deliver a second current to the reference structure, wherein the second current matches the control current, and wherein the reference structure defines a resistance that matches a resistance of a portion of the GIT, wherein both the load current and the control current flow through the portion of the GIT.

8. The driver circuit of claim 7, wherein to determine the load current, the driver circuit is configured to:

compare the voltage detected at the gate to the reference voltage; and determine the load current based on comparing the voltage detected at the gate to the reference voltage.

9. The driver circuit of claim 8, wherein to determine the load current, the driver circuit is configured to:

determine a voltage drop associated with load current based on subtracting the reference voltage from the voltage detected at the gate; and determine the load current based on the voltage drop associated with the load current.

10. A method performed by a gate driver circuit configured to control a gate injection transistor (GIT), the method comprising:

outputting a control current to a gate of the GIT;
detecting a voltage at the gate of the GIT; and
determining a load current through the GIT based on the voltage detected at the gate of the GIT, wherein the voltage at the gate of the GIT is dependent on both the load current and the control current, wherein determining the load current includes:

comparing the voltage detected at the gate to a fixed reference voltage; and determining the load current based on a pre-defined transfer function associated with the GIT, wherein the pre-defined transfer function defines both the load current through the GIT and the control current at the gate when the voltage detected at the gate is greater than a threshold defined in the pre-defined transfer function associated with the GIT.

11. The method of claim 10, wherein determining the load current based on the pre-defined function includes:

determining a total current though a portion of the GIT based on the voltage detected at the gate; and determining the load current based on a difference between the total current and the control current.

12. The method of claim 10, wherein outputting the control current includes:

outputting the control current in an initial boost phase, wherein the initial boost phase defines a first gate voltage; and outputting constant current in a drive phase that follows the boost phase, wherein the drive phase defines a second gate voltage that is lower than the first gate voltage, wherein detecting the voltage at the gate of the GIT comprises detecting the second gate voltage.

13. A method performed by a gate driver circuit configured to control a gate injection transistor (GIT), the method comprising:

outputting a control current to a gate of the GIT;
detecting a voltage at the gate of the GIT;
determining a load current through the GIT based on the voltage detected at the gate of the GIT, wherein the voltage at the gate of the GIT is dependent on both the load current and the control current; and generating a reference voltage based on a voltage drop over a reference structure, wherein generating the reference voltage comprises delivering a second current to the reference structure, wherein the second current matches the control current, wherein the reference structure defines a resistance that matches a resistance of a portion of the GIT, and wherein both the load current and the control current flow through the portion of the GIT.

14. The method of claim 13, wherein determining the load current comprises:

comparing the voltage detected at the gate to the reference voltage; and determining the load current based on comparing the voltage detected at the gate to the reference voltage.

15. The method of claim 14, wherein determining the load current comprises:

determining a voltage drop associated with load current based on subtracting the reference voltage from the voltage detected at the gate; and determining the load current based on the voltage drop associated with the load current.

16. A system comprising:

a gate injection transistor (GIT) configured to be controlled by a current signal at a gate of the GIT; and a driver circuit configured to control the GIT, wherein the driver circuit is configured to:

output a control current to the gate of the GIT;
detect a voltage at the gate of the GIT; and
determine a load current through the GIT based on the voltage detected at the gate of the GIT, wherein the voltage at the gate of the GIT is dependent on both the load current and the control current, wherein to determine the load current, the driver circuit is configured to:

compare the voltage detected at the gate to a fixed reference voltage; and determine the load current based on a pre-defined transfer function associated with the GIT, wherein the pre-defined transfer function defines both the load current through the GIT and the control current at the gate when the voltage detected at the gate is greater than a threshold defined in the pre-defined transfer function associated with the GIT.

17. The system of claim 16, wherein the GIT comprises a field effect transistor (FET) formed in gallium nitride (GaN).

* * * * *